United States Patent [19]

Mayer

[11] Patent Number: 4,496,241
[45] Date of Patent: Jan. 29, 1985

[54] PROCESS AND DEVICE FOR RELATIVELY ALIGNING THE IMAGE AND OBJECT SURFACES IN OPTICAL COPYING SYSTEMS

[75] Inventor: Herbert E. Mayer, Eschen, Liechtenstein

[73] Assignee: Censor Patent- und Versuchs-Anstalt, Vaduz, Liechtenstein

[21] Appl. No.: 476,249

[22] PCT Filed: Feb. 6, 1980

[86] PCT No.: PCT/AT80/00007
§ 371 Date: Oct. 14, 1980
§ 102(e) Date: Oct. 10, 1980

[87] PCT Pub. No.: WO80/01721
PCT Pub. Date: Aug. 21, 1980

Related U.S. Application Data

[63] Continuation-in-part of Ser. No. 197,991, Oct. 10, 1980.

[30] Foreign Application Priority Data

Feb. 14, 1979 [DE] Fed. Rep. of Germany ....... 2905635

[51] Int. Cl.³ .............................................. G01B 11/26
[52] U.S. Cl. .................................... 356/152; 250/548; 250/557; 356/400; 356/401
[58] Field of Search ....................... 356/152, 400, 401; 250/548, 557

[56] References Cited

U.S. PATENT DOCUMENTS 3,029,348 4/1962 Heinz .................................. 250/201
3,943,359 3/1976 Matsumoto et al. ................ 356/152
3,989,385 11/1976 Dill et al. ............................. 356/152
4,000,417 12/1976 Adkinsson et al. .................. 250/201
4,052,603 10/1977 Karlson ................................ 356/152
4,127,777 11/1978 Binder ................................. 356/400
4,153,371 5/1979 Koizumi et al. ..................... 356/401
4,167,677 9/1979 Suzki ................................... 356/401

FOREIGN PATENT DOCUMENTS 2427323 6/1974 Fed. Rep. of Germany .
2633297 7/1976 Fed. Rep. of Germany .

Primary Examiner—S. C. Buczinski
Attorney, Agent, or Firm—Karl F. Ross; Herbert Dubno

[57] ABSTRACT

In order to facilitate the alignment of a mask with a substrate on which the mask is to be imaged, a rectangular window on the mask is projected through a semitransparent mirror and an optical objective upon an area of the substrate carrying a line mark parallel to two edges of the window. The image of the window is retroprojected through the same objective, along with the associated line mark, and is focused via the semitransparent mirror upon a detection plane of an evaluator where the resulting composite image is scanned in a direction perpendicular to the line mark to determine the position of that mark relative to the window edges. The same scan, on traversing each window edge, yields a signal representing sharpness of focus in terms of the time required for passing between two predetermined thresholds of light intensity; the latter signal is used for adjusting the relative distance of the object and image surfaces respectively constituted by the mask and the substrate.

8 Claims, 6 Drawing Figures

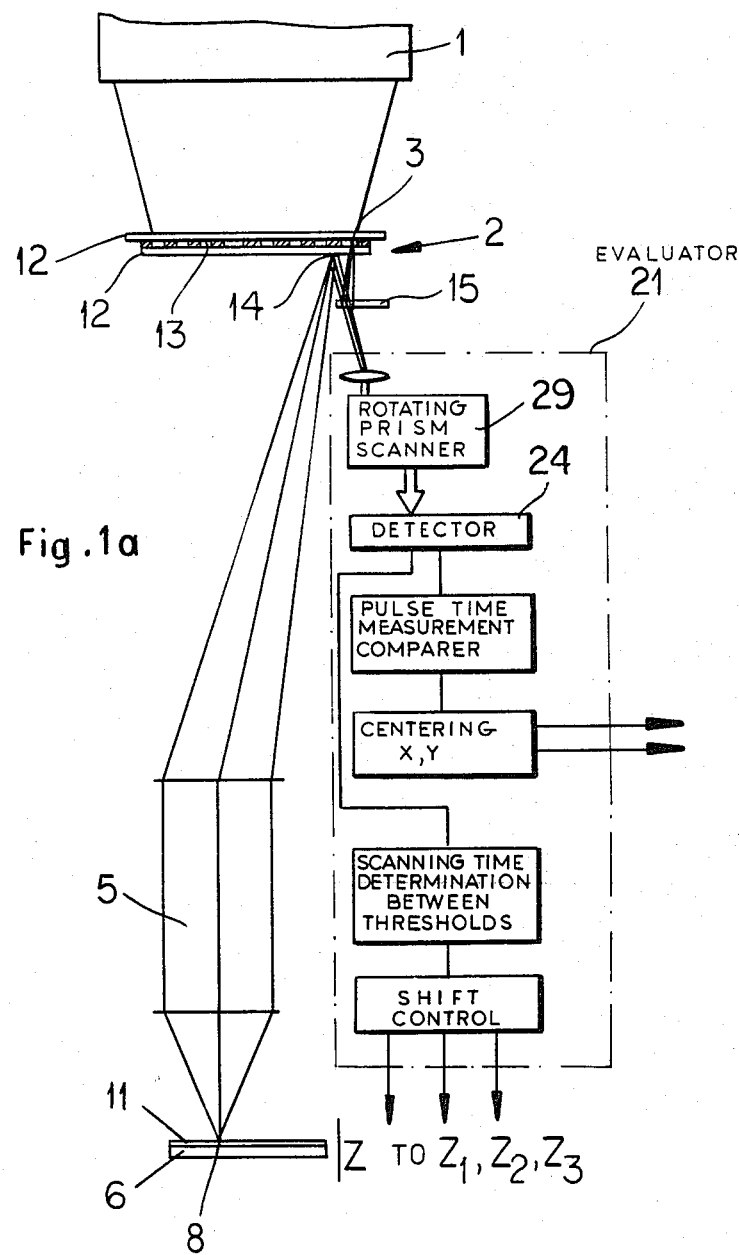

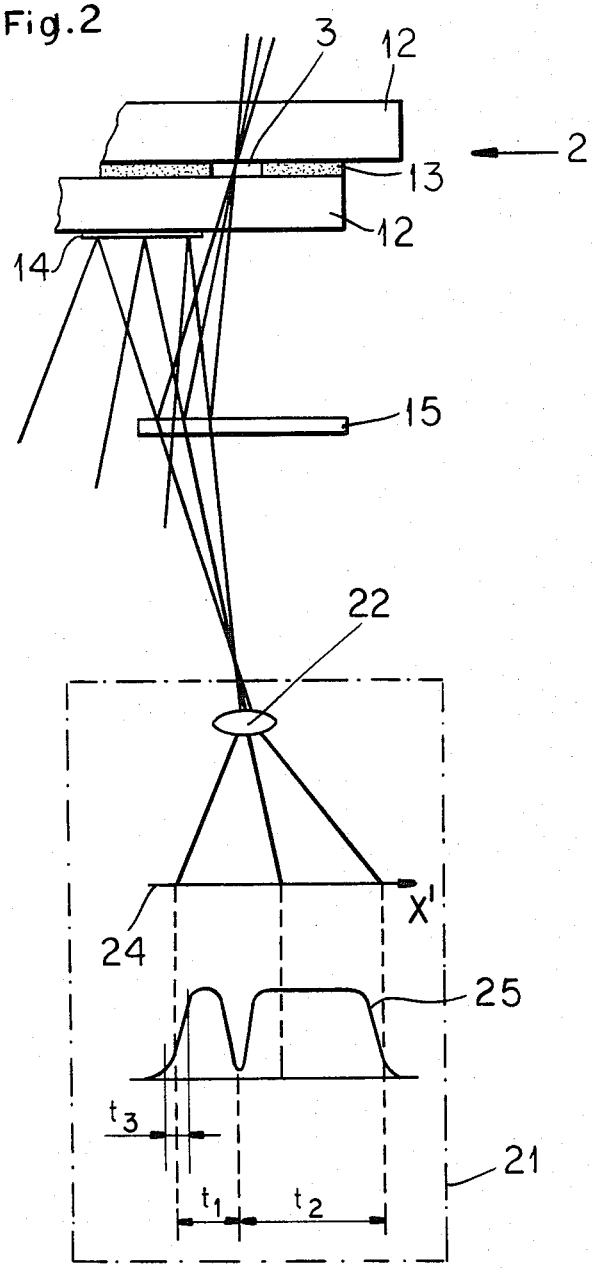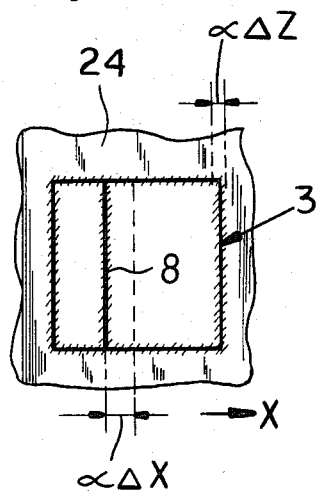

PROCESS AND DEVICE FOR RELATIVELY ALIGNING THE IMAGE AND OBJECT SURFACES IN OPTICAL COPYING SYSTEMS

This application is a continuation-in-part of application Ser. No. 197,991 filed Oct. 10, 1980.

FIELD OF THE INVENTION

My present invention relates to a process and a device for relatively aligning the image and object surfaces in optical copying systems, such as those serving for the projection copying of a mask on a semiconductor substrate for the production of integrated circuitries, wherein there is allocated to the image and/or the object surface at least one alignment mask whose image on the opposite surface is evaluated for the determination of alignment errors.

BACKGROUND OF THE INVENTION

For the projection copying of masks on a semiconductor substrate in the manufacture of integrated circuitries it is customary to align masks and semiconductor substrate, before the imaging of circuit patterns, relatively to each other in the image plane or the object plane, respectively.

For this purpose it has become known, for example, to allocate to the mask an alignment pattern consisting of a transparent window and to the semiconductor substrate an associated line mark. The window and the line mark are imaged in one another by way of the projection optic and are scanned by an evaluating device with the aid of a rotating prism. This evaluating device measures the time intervals between the arrival of the window edges and the line mark and emits control signals to servomotors for the displacement of the semiconductor substrate until the line mark lies at the center of the imaged window of the mask.

Besides this alignment process in the XY coordinates of the image or object plane it is also necessary with optical copying systems to provide for an exact focusing of the optical system, i.e. to arrange the image and object surfaces—given in the described instance of utilization by the masking layer on the one hand and by a photosensitive layer on the substrate surface on the other hand—exactly in the image and object planes.

For an automatic execution of this so-called Z adjustment it has become known, e.g. from German patent No. 24 27 323, to displace a focused beam in the object and/or the image plane along a circular path and to monitor automatically the state of focusing of the beam. Upon the occurrence of defocusings, site-dependent signals are generated for the correction of alignment errors. With this process it is disadvantageous that for the determination and correction of focusing errors a separate adjustment operation as well as relatively expensive equipment is required.

It has further become known from German open specification No. 26 33 297 to utilize adjustment marks, used for the XY adjustment, also for the Z adjustment. For this purpose, light rays reflected by the adjustment marks are directed onto photosensitive elements and the projection objective is shifted along the optical axis until the reflected light received by the photosensitive elements is at a minimum. The drawback of that process, however, is that only relatively large-area adjustment marks can be used and the achieved accuracy is often inadequate.

OBJECT OF MY PRESENT INVENTION

The object of the invention is therefore to provide a process and a device of the type initially stated which enables a highly accurate alignment of the image and/or object surfaces in the direction of the optical axis. The process should furthermore also facilitate the utilization of the alignment marks provided for the XY adjustment.

SUMMARY OF THE INVENTION

According to the process aspect of my invention, the intensity profile of the image of at least one alignment mark is measured and, in dependence upon the sharpness of one or more intensity changes, signals are generated which are used for the correction of the image and/or object surfaces in the direction of the optical axis. Since the sharpness of imaging is a function of the state of focusing, a maladjustment in the Z direction perpendicular to the object and image surfaces can be ascertained and corrected in the simplest way.

I prefer to design the alignment marks in a manner known per se as windows in the object surface bounded by at least two parallel edges, the images of the windows projected into the image surface being scanned in a direction normal to these parallel edges thereof. If such a scan is provided for adjustment in the image or the object plane, for example, the alignment error along the optical axis can be determined at the same time.

For this purpose it is advantageous to provide in the image surface a line element allocated to an alignment mark, extending parallel to the edges of the window, with generation of alignment signals depending on the distance the line element from the image of the edges of the window which are used for the correction of the image and/or object surfaces in a direction normal to the line element, and with generation of sharp-focusing signals depending on the sharpness of an image of the edges of the window or of the line element which are used for the relative displacement of the image and object surfaces in the direction of the optical axis.

Pursuant to a preferred embodiment, at least three alignment marks are disposed in spaced-apart relationship in the object plane, at least three separate shifting devices being provided for the adjustment of the image and/or object planes in the direction of the optical axis; in this way, the angular position can be corrected according to the difference of the signals obtained from the images of the alignment marks and the parallel distance between the object and image surfaces can be corrected according to the mean value of the signals.

Pursuant to an important feature of my invention, images of the alignment marks in the image plane are retroprojected via the imaging optic and are cast upon an evaluating device by a mirror or the like disposed in the region of the object plane. Each image is scanned in a detection plane of the evaluating device perpendicularly to the edges of the window, with generation of electrical signals proportional to intensity which are used for the correction of the image and/or object surfaces.

For the determination of the intensity profile it is advantageous if the evaluation device scans an image of an alignment mark with a predetermined velocity and if the time difference between the passage of the signals corresponding to the window edges through two threshold values is determined, the shifting devices for adjusting the position of the image and/or object surfaces being controlled in proportion to the time difference.

The corrective direction is advantageously determined in that after a first determination of the focusing of the image of an alignment mark the image and/or object surfaces are shifted in a predetermined direction along the optical axis whereupon a second determination of the defocusing is performed, and that upon an enlargement of the focusing error, i.e. with worsened imaging sharpness, the corrective shift along the optical axis is reversed.

BRIEF DESCRIPTION OF THE DRAWING

The above and other features of my invention are more fully explained hereinafter with reference to the accompanying drawing in which:

FIG. 1a shows the diagram of a ray path for an alignment mark;

FIG. 2 shows a schematic fragment of FIG. 1a;

FIG. 2a shows a top view of a detection plane;

DESCRIPTION OF PREFERRED EMBODIMENT

Figure 1:
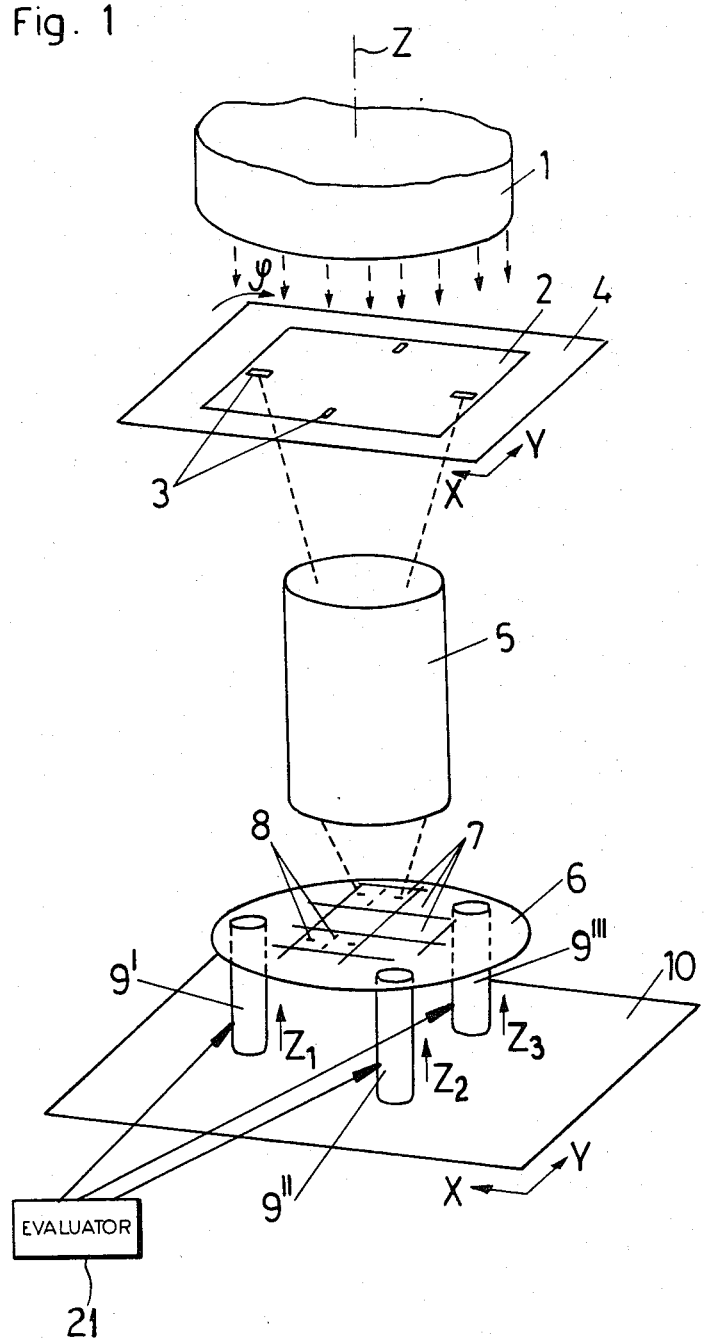
FIG. 1 shows in a perspective view the most significant elements of a partly conventional projection-copying system for the manufacture of integrated circuitries.

In FIG. 1 the basic components of a projection-copying system for the manufacture of integrated circuitries have been illustrated. It consists essentially of an illuminating device 1, a mask stage 4, a projection objective 5 and a coordinate table 10. A mask 2 to be imaged rests on the mask stage 4 in the object plane of the projection objective 5 while the semiconductor substrate is disposed in the image plane on three shifting devices 9' to 9'''.

The coordinate table 10 is designed in known manner for the stepwise displacement of the substrate 6 in order to image the circuit pattern of the mask 2 in consecutive steps on predetermined areas 7 according to the step-and-repeat process. In order to be able to perform before each imaging an exact alignment between substrate 6 and mask 2 relative to the projection optic 5, alignment patterns 3 are provided on the mask and adjustment marks 8 are provided on the areas 7 on the substrate. According to the detected alignment errors, the mask stage 4 may be shifted for example in the Cartesian coordinates XY of the object plane and the substrate can be shifted along the optical axis Z of the system. In order to be able to execute an angularly precise alignment of the substrate 6 in the image plane of the projection objective 5, three separately controllable shifting devices 9', 9'' and 9''' are provided.

FIG. 1a schematically shows the devices necessary for the determination of alignment errors. The mask 2 consists here of two glasses 12' and 12'' between which a masking layer 13 is disposed. An illuminating device 1 is again provided above the mask 2. The rays impinging from the illuminating device 1 upon an alignment mark 3, designed as a window with at least two parallel edges, are reflected by a semitransparent mirror 15 disposed below the mask 2 and are directed onto the area of the associated adjustment mark 8 of the substrate 6 via a confronting mirror 14 provided on the underside of the glass 12'. The image of the window 3 on the upper substrate side and the adjustment mark 8 are retroprojected by the projection objective 5 and are cast by the mirror 14 through the semitransparent mirror 15 onto an evaluating device 21.

FIG. 2 shows a fragment of the ray path of FIG. 1a. The evaluating device 21 includes a lens 22 which directs the ray bundle coming from the adjustment-mark area on the substrate onto a detection plane 24. The adjustment mark 8 is designed in the present case, as seen in FIG. 2a, as a line element extending parallel to two edges of the window 3 of the rectangular mask 2 which in the assigned position of the substrate 6 extends perpendicular to the direction X in which the alignment error is to be ascertained. The intensity profile of the composite image of the window 3 and the adjustment mark, produced on the detection plane 24, is represented by a curve 25. This intensity profile 25 is scanned in a direction normal to line element 8 or to the corresponding edges of the window 3. This can be carried out, for instance, in that a rotating prism casts the ray bundle upon a photoelectric element in front of which a slot extending parallel to the line element 8 is provided. The photoelectric element, however, could also form the detection plane 24 on a large area while a slot is oscillatingly displaced in front of that plane 24. Thus, a scanner diagrammatically indicated at 29 in FIG. 1a generates electrical signals according to the occurring intensity values. The alignment error $\Delta X$ normal to the corresponding edges of the window 3 as well as the focusing error is determined by measurement of the time difference between the passage of certain threshold values. If the time $t_1$ between the appearance of pulses representing the first window edge and the line element equals the time $t_2$ between the appearance of pulses representing the line element and the second window edge, the object and image surfaces are exactly aligned in their planes in the corresponding direction. The alignment of the object and image surfaces in the object and image planes of the projection objective 5 along the optical axis Z is determined by measurement of the slope of the image of the window edges. The rise time $t_3$ is the state of focusing; the utilization of the rate of change of a light-intensity signal for sharp-focusing purposes is well known in the art.

Figure 3:
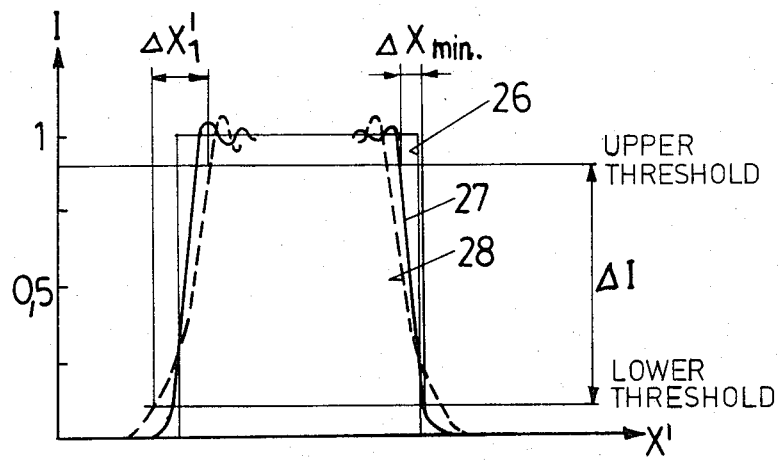
FIG. 3 shows the intensity profile of the alignment mark.
Figure 4:
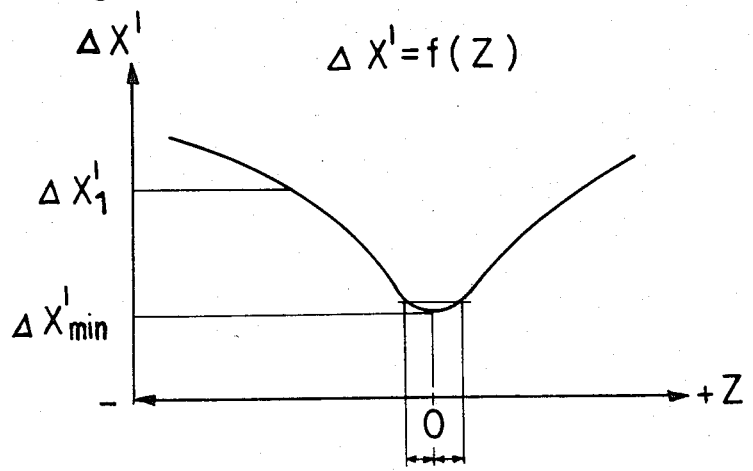
FIG. 4 shows the imaging sharpness of the alignment mark as a function of the defocusing.

In FIG. 3 the intensity profile of the window 3 imaged on the detection plane 24 in the direction X' has been illustrated. The theoretical, ideal profile of luminous intensity is represented by a rectangle 26 while actually, in the focusing position of the image and object surfaces, the profile 27 is measured with steep flanks having a slope $\Delta I/\Delta X$. If now, for example, the substrate surface is spaced from the image plane, the edges of the window 3 are blurred when imaged thereon and a profile 28 with rising flanks of lesser slope appears on the detection plane. Electrical signals corresponding to the intensity values of the scanned image elements are generated by a scan of the detection plane 24 in the direction X' and the time difference between the traverse of a lower and an upper threshold value is measured. This time difference is directly proportional to the width of a blur zone $\Delta Z$ (FIG. 2a) of the window and is thus a measure for the defocusing of the image surface. The image surface is therefore displaced in the direction of the optical axis until the steepest rise flanks of the intensity profile 27 are attained. FIG. 4 shows the width of the rise flanks of the intensity profile in dependence upon the displacement of the substrate surface from the image plane. When the substrate surface coincides with the image plane there appears the smallest width ΔX', whereas with deviations of the substrate surface in positive or negative Z direction the width ΔX' increases from its minimum value ΔX'$_{min}$ to a higher value ΔX'$_1$.

If at least three alignment patterns and associated adjustment marks are provided, unevennesses of the substrate surface can also be compensated by means 30, FIG. 1a, correspondingly controlling the separate shifting devices 9', 9'', 9''' as indicated in FIG. 1 by arrows.

A particular advantage of the process according to the invention resides in that the ascertainment of the adjustment errors can also be performed in the exposure light, i.e. during the imaging of circuit patterns. In this way the monitoring of the state of focusing and simultaneous correction is possible. Furthermore, no separate adjustment marks or special devices need be provided since the process can also be carried out with the means provided for the XY adjustment. The direction of the corrective motion can be established, for example, by twice measuring the focusing error with an intervening slight displacement of the substrate 6 along the optical axis. It is likewise possible to determine the requisite direction from an image of the line element.

I claim:

1. A process for relatively aligning an object surface and an image surface in a projection-copying system, comprising the steps of:
    providing a window with two parallel edges on said object surface;
    providing a line mark parallel to said edges on an area of said image surface designed to coincide with an image of said window;
    projecting an image of said window upon said area through a projection objective and a semitransparent mirror inserted between said object surface and said objective;
    retroprojecting an image of the projected window image along with an image of said line mark by way of said objective and said semitransparent mirror upon a detection plane to form a composite image thereon;
    scanning said composite image in a direction perpendicular to said line mark and said parallel edges, thereby generating electrical signals corresponding to the luminous intensity of the scanned image elements;
    comparing a time interval elapsing between a first pulse and a second pulse, respectively representing a traverse of one of said edges and of said line mark, with a time interval elapsing between said second pulse and a third pulse, representing a traverse of the other of said edges, as a measure of the position of said line mark relative to said window;
    relatively displacing said object and image surfaces to center the image of said line mark in the retroprojected image of said window;
    determining the scanning time required for one of said pulses to pass between a predetermined lower and a predetermined higher intensity threshold as a measure of sharpness of focus; and
    varying the distance between said object and image surfaces along the optical axis of said objective until said scanning time attains a minimum value.

2. A process as defined in claim 1 wherein light rays traversing said objective between said semitransparent mirror and said image surface are reflected by another mirror confronting said semitransparent mirror.

3. A process as defined in claim 2 wherein said confronting mirror is disposed in the vicinity of said object surface.

4. A process as defined in claim 1, 2 or 3 wherein said one of said pulses is a pulse generated upon a traverse of one of said edges.

5. In a projection-copying system comprising an object surface provided with a window having two parallel edges, an image surface parallel to said object surface provided with a line mark parallel to said edges, a projection objective between said surfaces having an optical axis substantially perpendicular thereto for projecting an image of said window upon an area of said image surface which contains said line mark and which is to coincide with the image of said window in a position of relative alignment of said surfaces, and control means for relatively displacing said surfaces to center said line mark in the image of said window,
    the combination therewith of a semitransparent mirror interposed between said object surface and said objective for directing light rays retroprojected from the window image through said objective onto a detection plane to produce thereon a composite image of said window and said line mark, said control means including an evaluator scanning said composite image in a direction perpendicular to said line mark and said edges for generating electrical signals corresponding to luminous intensity, said control means further including shifting means responsive to said signals for adjusting the distance between said surfaces to establish a position of sharp focus as determined by a minimum scanning period between predetermined signal thresholds.

6. The combination defined in claim 5, further comprising a reflector confronting said semitransparent mirror in the path of light rays passing between said semitransparent mirror and said objective.

7. The combination defined in claim 6 wherein said reflector is disposed in the vicinity of said object surface.

8. The combination defined in claim 5, 6 or 7 wherein said shifting means comprises at least three spaced-apart shifters engaging different portions of a substrate forming said image surface.

* * * * *